(12) United States Patent
Kim et al.

(10) Patent No.: US 11,049,661 B2
(45) Date of Patent: Jun. 29, 2021

(54) MULTILAYER ELECTRONIC COMPONENT

(71) Applicant: SAMSUNG ELECTRO-MECHANICS CO., LTD., Suwon-si (KR)

(72) Inventors: Je Jung Kim, Suwon-si (KR); Seung Ryeol Lee, Suwon-si (KR); Su Kyoung Cha, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/812,990

(22) Filed: Mar. 9, 2020

(65) Prior Publication Data

US 2021/0082623 A1    Mar. 18, 2021

(30) Foreign Application Priority Data

Sep. 18, 2019  (KR) .......................... 10-2019-0114443

(51) Int. Cl.
| | |
|---|---|
| *H01G 4/30* | (2006.01) |
| *H01G 4/232* | (2006.01) |
| *H05K 1/09* | (2006.01) |
| *H05K 1/02* | (2006.01) |
| *H05K 1/03* | (2006.01) |
| *H01G 4/12* | (2006.01) |

(52) U.S. Cl.
CPC .................. *H01G 4/30* (2013.01); *H01G 4/12* (2013.01); *H01G 4/2325* (2013.01); *H05K 1/0271* (2013.01); *H05K 1/0306* (2013.01); *H05K 1/09* (2013.01)

(58) Field of Classification Search
CPC .......... H01G 4/30; H01G 4/2325; H01G 4/12; H05K 1/09; H05K 1/0271; H05K 1/0306
USPC ...................................................... 361/301.4
See application file for complete search history.

(56) References Cited

U.S. PATENT DOCUMENTS

| | | |
|---|---|---|
| 2013/0220696 A1 | 8/2013 | Otani |
| 2014/0043724 A1 | 2/2014 | Kang et al. |
| 2014/0182907 A1* | 7/2014 | Lee .......................... H01G 4/30 |
| | | 174/258 |

(Continued)

FOREIGN PATENT DOCUMENTS

| | | |
|---|---|---|
| JP | 2005-197530 | 7/2005 |
| JP | 5477476 B2 | 4/2014 |
| KR | 10-2014-0021416 A | 2/2014 |

*Primary Examiner* — Sherman Ng
(74) *Attorney, Agent, or Firm* — Morgan, Lewis & Bockius LLP

(57) ABSTRACT

A multilayer electronic component includes a body including a dielectric layer and first and second internal electrodes, and including first to sixth surfaces, a first external electrode including a first electrode layer extending to a portion of each of the first, second, fifth, and sixth surfaces and a first conductive resin layer, and a second external electrode including a second electrode layer extending to a portion of each of the first, second, fifth, and sixth surfaces and a second conductive resin layer. R1 and R2 satisfy R1>R2, in which R1 is defined as a surface roughness of each of the first, second, fifth, and sixth surfaces in contact with the first and second electrode layers, and R2 is defined as a surface roughness of each of the first, second, fifth, and sixth surfaces in contact with the first and second conductive resin layers.

16 Claims, 6 Drawing Sheets

(56) References Cited

U.S. PATENT DOCUMENTS

| | | | |
|---|---|---|---|
| 2015/0109718 A1* | 4/2015 | Choi | H01G 4/12 |
| | | | 361/304 |
| 2017/0032896 A1* | 2/2017 | Otani | H01G 4/232 |
| 2017/0098506 A1* | 4/2017 | Ando | H01G 4/232 |
| 2018/0166215 A1* | 6/2018 | Hamanaka | H01G 4/232 |

* cited by examiner

MULTILAYER ELECTRONIC COMPONENT

CROSS-REFERENCE TO RELATED APPLICATION(S)

This application claims benefit of priority to Korean Patent Application No. 10-2019-0114443 filed on Sep. 18, 2019 in the Korean Intellectual Property Office, the disclosure of which is incorporated herein by reference in its entirety.

TECHNICAL FIELD

The present disclosure relates to a multilayer electronic component.

BACKGROUND

A multilayer ceramic capacitor (MLCC), a multilayer electronic component, is a chip-type condenser mounted on the printed circuit boards of a variety of electronic products including imaging devices, such as a liquid crystal display (LCD), a plasma display panel (PDP), and the like, computers, smartphones, mobile phones, and the like, and may be configured to charge electricity in or discharge electricity from the devices.

A multilayer ceramic capacitor may be used as a component of various electronic devices as a multilayer ceramic capacitor is relatively small in size, may secure high capacity and may be easily mounted. As electronic devices such as computers, mobile devices, and the like, have been designed to have reduced sizes and to operate at high power, there has been increased demand for miniaturization and high capacity of multilayer ceramic capacitors.

Also, recently, there has been increased interest in electrical components, and multilayer ceramic capacitors have been required to have high reliability and high strength properties to be used in vehicles or infotainment systems.

To secure properties of high reliability and high strength, a method of changing an external electrode including a general electrode layer to an external electrode having a dual layer structure including an electrode layer and a conductive resin layer has been suggested.

In the case of a dual layer structure including an electrode layer and a conductive resin layer, a resin composition containing a conductive material may be applied to an electrode layer, and the dual layer structure may absorb external impacts and may prevent permeation of a plating solution, thereby improving reliability.

However, as standards of high reliability and high strength properties required in the related field have been raised, a method for further improving high reliability and high strength properties has been required.

SUMMARY

An aspect of the present disclosure is to provide a multilayer electronic component in which cohesion force between a body and an electrode layer is improved.

An aspect of the present disclosure is to provide a multilayer electronic component having improved moisture resistance reliability.

An aspect of the present disclosure is to provide a multilayer electronic component having improved warpage strength properties.

According to an aspect of the present disclosure, a multilayer electronic component includes a body including a dielectric layer and first and second internal electrodes alternately layered in a layering direction with the dielectric layer interposed therebetween, and including first and second surfaces opposing each other in the layering direction, third and fourth surfaces connected to the first and second surfaces and opposing each other, and fifth and sixth surfaces connected to the first to fourth surfaces and opposing each other; a first external electrode disposed on the third surface, connected to the first internal electrode, and including a first electrode layer extending to a portion of each of the first, second, fifth, and sixth surfaces and a first conductive resin layer covering the first electrode layer; and a second external electrode disposed on the fourth surface, connected to the second internal electrode, and including a second electrode layer extending to a portion of each of the first, second, fifth, and sixth surfaces and a second conductive resin layer covering the second electrode layer. R1 and R2 satisfy R1>R2, in which R1 is defined as a surface roughness of each of the first, second, fifth, and sixth surfaces in contact with the first and second electrode layers is defined as R1, and R2 is defined as a surface roughness of each of the first, second, fifth, and sixth surfaces in contact with the first and second conductive resin layers.

According to an aspect of the present disclosure, a multilayer electronic component includes a body including a dielectric layer and a capacitance forming portion including first and second internal electrodes alternately layered in a layering direction with the dielectric layer interposed therebetween and cover portions respectively disposed on and below the capacitance forming portion, and including first and second surfaces opposing each other in the layering direction, third and fourth surfaces connected to the first and second surfaces and opposing each other, and fifth and sixth surfaces connected to the first to fourth surfaces and opposing each other; a first external electrode disposed on the third surface, connected to the first internal electrode, and including a first electrode layer extending to a portion of each of the first, second, fifth, and sixth surfaces and a first conductive resin layer covering the first electrode layer; and a second external electrode 132 disposed on the fourth surface, connected to the second internal electrode, and including a second electrode layer extending to a portion of each of the first, second, fifth, and sixth surfaces and a second conductive resin layer covering the second electrode layer. R1' and R2 satisfy R1'>R2, in which R1' is defined as a surface roughness of the cover portion in contact with the first and second electrode layers is defined as R1', and R2 is defined as a surface roughness of each of the first, second, fifth, and sixth surfaces in contact with the first and second conductive resin layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
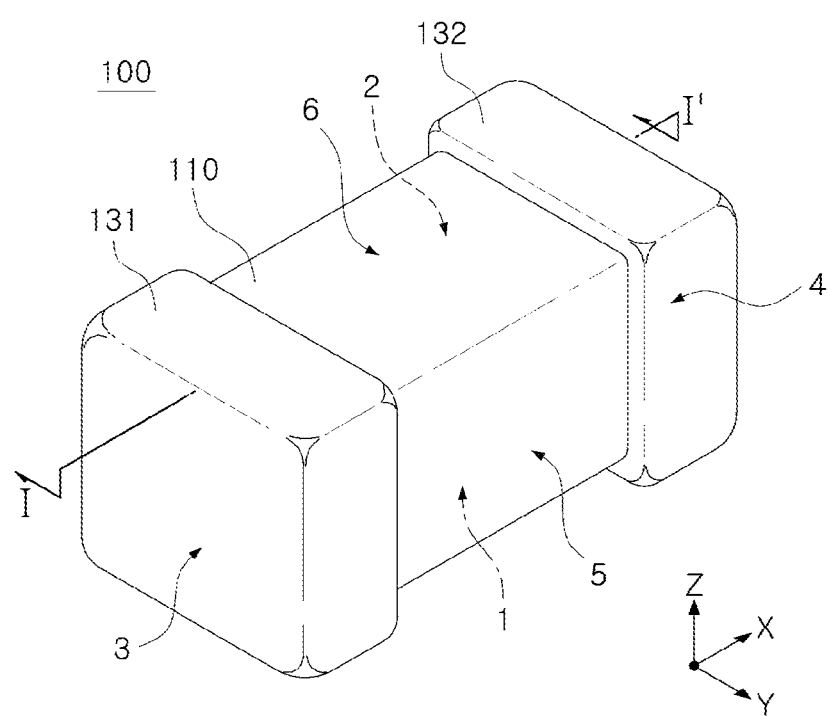
FIG. 1 is a perspective diagram illustrating a multilayer electronic component according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Accordingly, shapes and sizes of elements in the drawings may be exaggerated for clarity of description, and elements indicated by the same reference numeral are the same elements in the drawings.

In the drawings, certain elements may be omitted to allow the present disclosure to be clearly described, and to clearly express a plurality of layers and areas, thicknesses may be magnified. The same elements having the same function within the scope of the same concept will be described using the same reference numerals. Further, throughout the specification, it will be understood that when a portion "includes" an element, it can further include another element, not excluding another element, unless otherwise indicated.

In the drawing, an X direction is a second direction, an L direction, or a length direction, a Y direction is a third direction, a W direction, or a width direction, and a Z direction is a first direction, a layering direction, a T direction, or a thickness direction.

Multilayer Electronic Component

FIG. 1 is a perspective diagram illustrating a multilayer electronic component according to an example embodiment.

Figure 2:
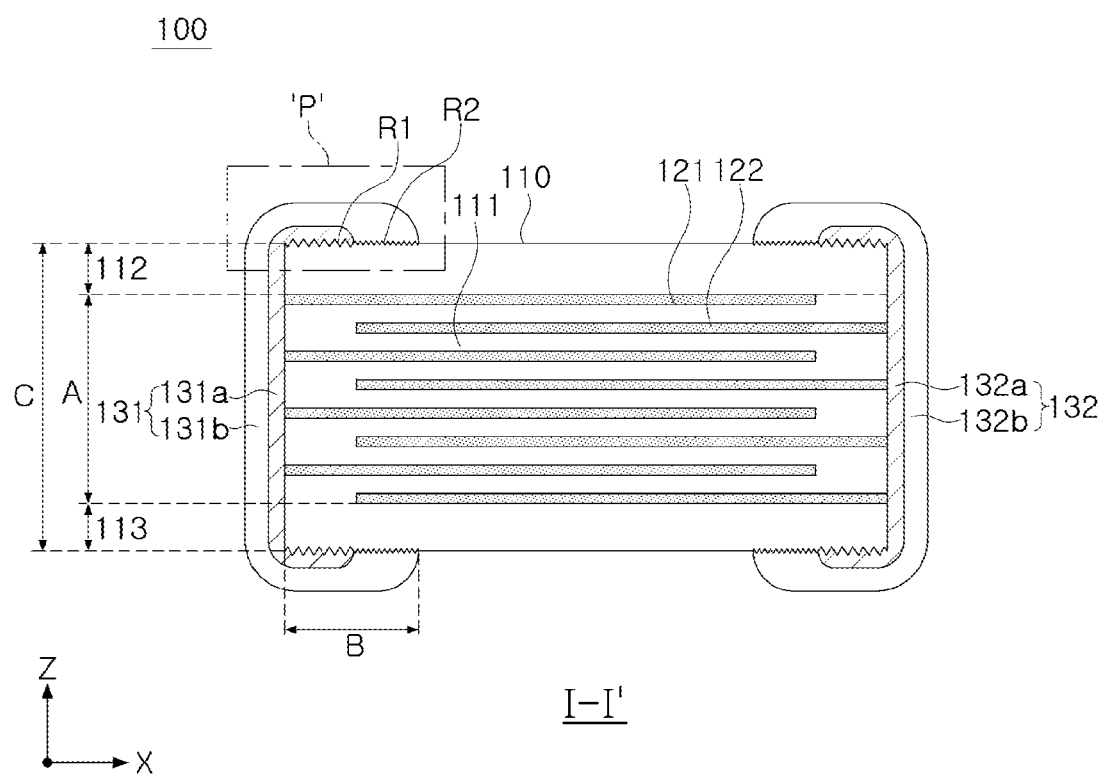
FIG. 2 is a cross-sectional diagram taken along line I-I' in FIG. 1.

FIG. 2 is a cross-sectional diagram taken along line I-I' in FIG. 1.

Figure 3:
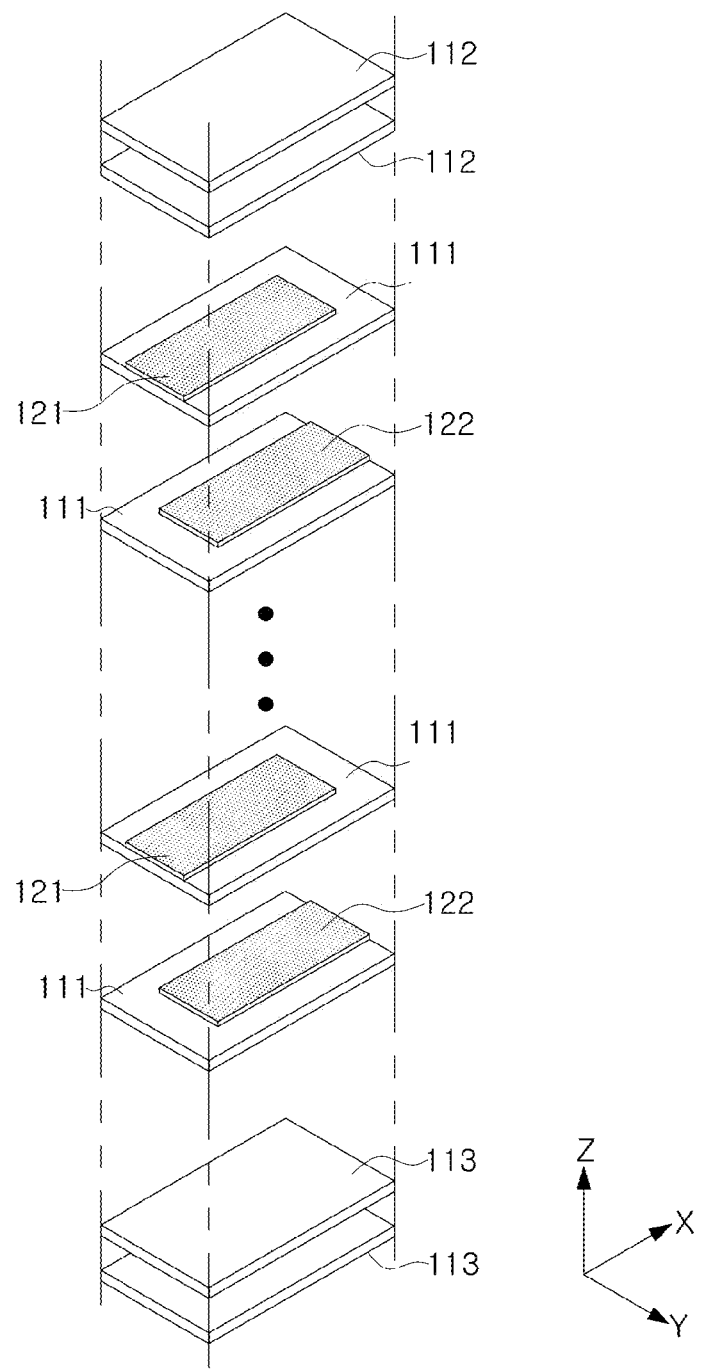
FIG. 3 is an exploded perspective diagram illustrating a body in which a dielectric layer and an internal electrode are layered according to an example embodiment of the present disclosure.

FIG. 3 is an exploded perspective diagram illustrating a body in which a dielectric layer and an internal electrode are layered according to an example embodiment.

Figure 4:
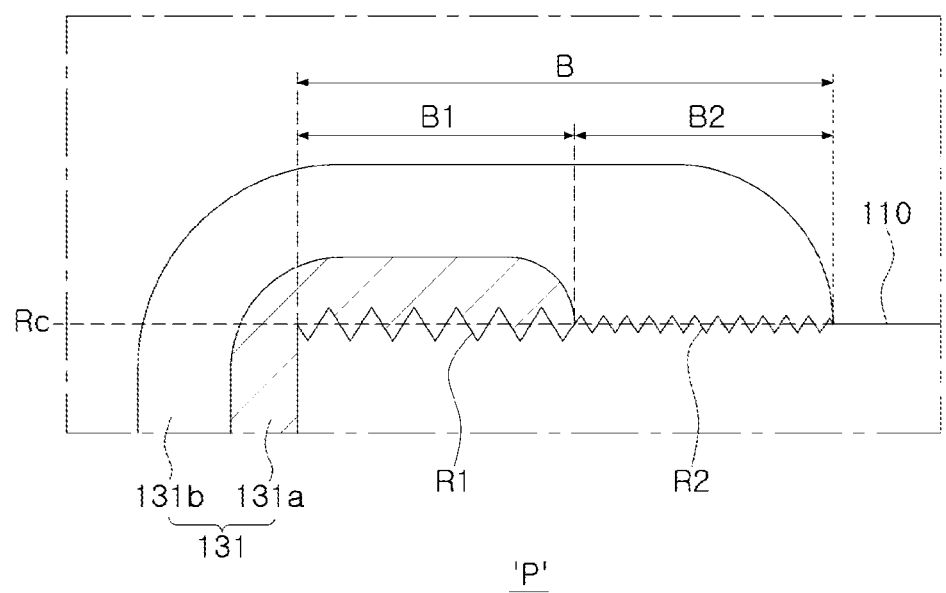
FIG. 4 is an enlarged diagram illustrating region P illustrated in FIG. 2.

FIG. 4 is an enlarged diagram illustrating region P illustrated in FIG. 2.

In the description below, a multilayer electronic component will be described in accordance with an example embodiment with reference to FIGS. 1 to 4.

A multilayer electronic component 100 in the example embodiment may include a body 110 including a dielectric layer 111 and first and second internal electrodes 121 and 122 alternately layered with the dielectric layer interposed therebetween, and including first and second surfaces 1 and 2 opposing each other in the layering direction, third and fourth surfaces 3 and 4 connected to the first and second surfaces and opposing each other, and fifth and sixth surfaces 5 and 6 connected to the first to fourth surfaces and opposing each other, a first external electrode 131 disposed on the third surface and connected to the first internal electrode, and including a first electrode layer 131a extending to a portion of each of the first, second, fifth, and sixth surfaces and a first conductive resin layer 131b covering the first electrode layer, and a second external electrode 132 disposed on the fourth surface and connected to the second internal electrode, and including a second electrode layer 132a extending to a portion of each of the first, second, fifth, and sixth surfaces and a second conductive resin layer 132b covering the second electrode layer, and when a surface roughness of each of the first, second, fifth, and sixth surfaces in contact with the first and second electrode layers is defined as R1, and a surface roughness of each of the first, second, fifth, and sixth surfaces in contact with the first and second conductive resin layers is defined as R2, R1 and R2 may satisfy R1>R2.

In the body 110, the dielectric layer 111 and the internal electrodes 121 and 122 may be alternately layered.

The body 110 may not be limited to any particular shape. As illustrated, the body 110 may have a hexahedral shape or a shape similar to a hexahedron. Due to contraction of ceramic powder particles included in the body 110 during a sintering process, the body 110 may not have an exactly hexahedral shape with perfectly straight lines, but may have a substantially hexahedral shape.

The body 110 may have first and second surfaces 1 and 2 opposing each other in a thickness direction (Z direction), third and fourth surfaces 3 and 4 connected to the first and second surfaces 1 and 2 and opposing each other in a length direction (X direction), and fifth and sixth surfaces 5 and 6 connected to the first and second surfaces 1 and 2 and the third and fourth surfaces 3 and 4, and opposing each other in a width direction (Y direction).

The plurality of the dielectric layers 111 forming the body 110 may be in a sintered state, and may be integrated such that boundaries between adjacent dielectric layers 111 may be difficult to identify without using a scanning electron microscope (SEM).

According to the example embodiment, a material of the dielectric layer 111 may not be limited to any particular material as long as sufficient capacitance is able to be obtained therewith. For example, as the material, a barium titanate material, a Perovskite material compound with lead (Pb), a strontium titanate material, or the like, may be used.

As the material of the dielectric layer 111, various ceramic additives, organic solvents, plasticizers, coupling agents, dispersing agents, and the like, may be added in addition to power such as barium titanate ($BaTiO_3$) powder, or the like, depending on an intended purpose.

The body 110 may include the capacitance forming portion A disposed in the body 110 and forming capacitance including the first internal electrode 121 and the second internal electrode 122 opposing each other with the dielectric layer 111 interposed therebetween, and cover portions 112 and 113 disposed on and below the capacitance forming portion A.

The capacitance forming portion A may contribute to forming capacitance of the capacitor, and may be formed by alternatively layering the plurality of first and second internal electrodes 121 and 122 with the dielectric layer 111 interposed therebetween.

The upper cover portion 112 and the lower cover portion 113 may be formed by disposing a single dielectric layer or two or more dielectric layers on each of upper and lower surfaces of the capacitance forming portion, and may prevent damage to an internal electrode caused by physical or chemical stress.

The upper cover portion 112 and the lower cover portion 113 may not include an internal electrode, and may include a material the same as a material of the dielectric layer 111.

The plurality of internal electrodes 121 and 122 may oppose each other with the dielectric layer 111 interposed therebetween.

The internal electrodes 121 and 122 may include the first and second internal electrodes 121 and 122 alternately disposed with the dielectric layer 111 interposed therebetween and opposing each other.

The first and second internal electrodes 121 and 122 may be exposed to the third and fourth surfaces 3 and 4 of the body 110, respectively.

Referring to FIG. 2, the first internal electrode 121 may be spaced apart from the fourth surface 4 and may be exposed through the third surface 3. The second internal electrode 122 may be spaced apart from the third surface 3 and may be exposed through the fourth surface 4. The first external electrode 131 may be disposed on the third surface 3 of the body and may be connected to the first internal electrode 121, and the second external electrode 132 may be disposed on the fourth surface 4 of the body and may be connected to the second internal electrode 122.

The first and second internal electrodes 121 and 122 may be electrically isolated from each other by the dielectric layer 111 interposed therebetween.

Referring to FIG. 3, the body 110 may be formed by alternatively layering the dielectric layer 111 on which the first internal electrode 121 is printed and the dielectric layer 111 on which the second internal electrode 122 is printed in the thickness direction (Z direction) and performing a sintering process.

A material for forming the first and second internal electrodes 121 and 122 may not be limited to any particular material. For example, the first and second internal electrodes 121 and 122 may be formed using a conductive paste including one or more of nickel (Ni), copper (Cu), palladium (Pd), silver (Ag), gold (Au), platinum (Pt), tin (Sn), tungsten (W), titanium (Ti), and alloys thereof.

As a method of printing the conductive paste, a screen-printing method, a gravure printing method, or the like, may be used, but the method is not limited thereto.

The external electrodes 131 and 132 may be disposed on the body 110 and may be connected to the internal electrodes 121 and 122. As illustrated in FIG. 2, the external electrodes 131 and 132 may include the first and second external electrodes 131 and 132 connected to the first and second internal electrodes 121 and 122, respectively.

The first and second external electrodes 131 and 132 may be electrically connected to the first and second internal electrodes 121 and 122, respectively, to form capacitance, and the second external electrode 132 may be connected to a potential different from a potential to which the first external electrode 131 is connected.

The first external electrode 131 may include the first electrode layer 131a and the first conductive resin layer 131b.

The first electrode layer 131a may be disposed on the third surface 3, may be connected to the first internal electrode 121, and may extend to a portion of each of the first, second, fifth, and sixth surfaces 1, 2, 5, and 6. The first conductive resin layer 131b may cover the first electrode layer 131a.

The second external electrode 132 may include the second electrode layer 132a and the second conductive resin layer 132b.

The second electrode layer 132a may be disposed on the fourth surface 4, may be connected to the second internal electrode 122, and may extend to a portion of each of the first, second, fifth, and sixth surfaces 1, 2, 5, and 6. The second conductive resin layer 132b may cover the second electrode layer 132a.

A region of the external electrodes 131 and 132 disposed on the third and fourth surfaces may be defined as a connection portion C, and a region disposed on the first, second, fifth, and sixth surfaces 1, 2, 5, and 6 may be defined as a band portion B.

The first external electrode 131 may include the connection portion C disposed on the third surface of the body and the band portion B extending to a portion of each of the first, second, fifth, and sixth surfaces 1, 2, 5, and 6 from the connection portion. Similarly, the second external electrode 132 may include the connection portion C disposed on the fourth surface of the body and the band portion B extending to a portion of each of the first, second, fifth, and sixth surfaces 1, 2, 5, and 6 from the connection portion.

In the example embodiment, when a surface roughness of each of the first, second, fifth, and sixth surfaces 1, 2, 5, and 6 in contact with the first and second electrode layers 131a and 132a is defined as R1, and a surface roughness of each of the first, second, fifth, and sixth surfaces 1, 2, 5, and 6 in contact with the first and second conductive resin layers 131b and 132b is defined as R2, R1 and R2 may satisfy R1>R2.

Accordingly, the surface roughness R1 of the body in contact with the electrode layer of the band portion B may be greater than the surface roughness R2 of the body in contact with the conductive resin layer of the band portion B.

When warpage stress is applied to the multilayer electronic component 100, the conductive resin layers 131b and 132b may peel off and may alleviate stress. Accordingly, stress applied to the body 110 may be reduced such that cracks in the body may be prevented.

However, as the conductive resin layers 131b and 132b peel off, the electrode layers 131a and 132a may also peel off, or oxidation may occur on the ends of the electrode layers 131a and 132a.

Accordingly, moisture may permeate the ends of a portion in which the peeling off occurs or the exposed ends of the electrode layers 131a and 132a such that insulation resistance may degrade or shorts may occur.

When a surface roughness of the body 110 is controlled to satisfy R1>R2 as in the example embodiment, cohesion force between the body 110 and the electrode layers 131a and 132a may improve, and the conductive resin layers 131b and 132b may peel off, such that the alleviation of stress may improve. Accordingly, warpage strength properties and moisture resistance reliability of the multilayer electronic component 100 may improve.

When a surface roughness of the body 110 is controlled to satisfy R1>R2 as in the example embodiment, even when the conductive resin layers 131b and 132b peel off, the electrode layers 131a and 132a may be prevented from peeling off or oxidation on the ends of the exposed electrode layers 131a and 132a may be prevented. Accordingly, degradation of insulation resistance or shorts may be prevented.

Surface roughness may refer to a degree of serrations formed on a surface when the surface is processed.

Surface roughness may be created by a tool used for a process, whether a process method is appropriate or not, scratches on a surface, rust, an etching process, and the like. With respect to representing a degree of roughness, a surface may be cut out perpendicularly and a cross-sectional surface formed by the cutting out may have serrations or unevenness. A height from a top to a bottom may be defined as a maximum surface roughness.

Referring to FIG. 4, as a method for calculating an arithmetical average roughness, a conceptual arithmetical average line Rc may be disposed with respect to a surface roughness of an interfacial surface between the band portion B of the external electrode and the body 110.

Each distance (e.g., $r_1, r_2, r_3 \ldots r_n$ may be measured in a region B1 of the band portion B in which the electrode layer is in contact with the body and a region B2 of the band portion B in which the conductive resin layer is in contact with the body) with reference to the conceptual arithmetical average line Rc of the surface roughness, and an arithmetical average roughness of each of R1 and R2 may be calculated using an average value of the distances as in Equation 1.

$$\text{ARITHMETICAL-AVERAGE-ROUGHNESS} = \frac{|r_1|+|r_1|+|r_2|+|r_3|+\ldots+|r_n|}{n} \quad [\text{Equation 1}]$$

An arithmetical average roughness of R1 may be greater than 0.2 μm and 3.0 μm or less.

When an arithmetical average roughness of R1 is 0.2 μm or less, improvement of physical cohesion force between the electrode layers 131a and 132a and the body 110 obtained by an anchor effect may be insufficient. When the improvement of physical cohesion force between the electrode layers 131a and 132a and the body 110 is insufficient, warpage stress may be applied such that the conductive resin layers 131b and 132b may peel off. Accordingly, the electrode layers 131a and 132a may also peel off, or oxidation may occur on ends of the electrode layers 131a and 132a. Accordingly, insulation resistance may degrade or shorts may occur.

When an arithmetical average roughness of R1 exceeds 3.0 μm, stress may be concentrated on the electrode layers 131a and 132a when stress occurs such that cracks may be created.

Sample chips were manufactured while changing R1 and R2, and moisture resistance reliability was assessed. Table 1 lists the result of the assessment of moisture resistance reliability.

100 sample chips were prepared for each test No., and 5 mm of warpage stress was applied. When a voltage of 50V was applied at a temperature of 85° C. and in relative humidity of 85% for 1000 hours, samples in which an insulation resistance value decreased to 1/10 or lower as compared to an initial value were determined as being defective among 100 sample chips, and the number of the defective samples is listed.

TABLE 1

| Test No. | R1(μm) | R2(μm) | Moisture resistance reliability |
|---|---|---|---|
| 1 | 0.05 | 0.05 | 3/100 |
| 2 | 0.10 | 0.10 | 4/100 |
| 3 | 0.15 | 0.15 | 1/100 |
| 4 | 0.20 | 0.20 | 1/100 |
| 5 | 0.30 | 0.20 | 0/100 |
| 6 | 0.40 | 0.20 | 0/100 |
| 7 | 0.60 | 0.20 | 0/100 |
| 8 | 0.80 | 0.20 | 0/100 |

Referring to Table 1, test Nos. 1 to 4 in which R1 and R2 were the same included samples of which reliability was defective, which indicates that moisture resistance reliability degraded.

It has been indicated that test Nos. 5 to 8 in which R1 was greater than R2 had excellent moisture resistance reliability.

Test Nos. 1 to 4, R1 of which was 0.2 μm or less, included samples of which moisture resistance reliability was defective, which indicates that moisture resistance reliability degraded.

It has been indicated that test Nos. 5 to 8, R1 of which is greater than 0.2 μm, had excellent moisture resistance reliability.

An arithmetical average roughness of R2 may be 0.3 μm or less.

When an arithmetical average roughness of R2 exceeds 0.3 μm, cohesion force between the conductive resin layers 131b and 132b and the body 110 may increase such that warpage cracks may be created from ends of the conductive resin layers 131b and 132b before the conductive resin layers 131b and 132b peel off.

An arithmetical average roughness of R2 may be greater than an arithmetical average roughness of a region of the first, second, fifth, and sixth surfaces 1, 2, 5, and 6 which is not in contact with the first and second external electrodes 131 and 132.

When an arithmetical average roughness of a region of the first, second, fifth, and sixth surfaces 1, 2, 5, and 6 which is not in contact with the first and second external electrodes 131 and 132 is the same as or greater than an arithmetical average roughness of R2, paste or a plating solution may bleed or other issues may occur.

An arithmetical average roughness of R1 is greater than an arithmetical average roughness of the third and fourth surfaces of the body 110.

When an arithmetical average roughness of the third and fourth surfaces is the same as or greater than an arithmetical average roughness of R1, electrical connectivity between the internal electrodes 121 and 122 and the electrode layers 131a and 132a may degrade.

The electrode layers 131a and 132a may include a conductive metal and glass.

A conductive metal used for the electrode layers 131a and 132a may not be limited to any particular material. Any material which may be electrically connected to the internal electrode to form capacitance may be used. For example, as a conductive metal, one or more elements selected from a group consisting of copper (Cu), silver (Ag), nickel (Ni), and alloys thereof may be used.

The electrode layers 131a and 132a may be formed by applying a conductive paste prepared by adding glass frit to the conductive metal powder, and performing a sintering process.

The conductive resin layers 131b and 132b may include a conductive metal and a base resin.

A conductive metal included in the conductive resin layers 131b and 132b may allow the conductive resin layers 131b and 132b to electrically connect to the electrode layers 131a and 132a.

A conductive metal included in the electrode layers 131a and 132a may not be limited to any particular material. Any material which may be electrically connected to the electrode layers 131a and 132a may be used. For example, a conductive metal may include one or more elements selected from a group consisting of copper (Cu), silver (Ag), nickel (Ni), and alloys thereof.

A conductive metal included in the conductive resin layers 131b and 132b may include one or more of spherical powder and flake powder. Accordingly, the conductive metal may only include flake powder, or may only include spherical powder, or may include a mixture of flake powder and spherical powder.

The spherical powder may also include power particles which do not have a completely spherical shape. For example, the spherical powder may include powder particles each having a length ratio between a major axis and a minor axis (a major axis/a minor axis) to be 1.45 or lower.

The flake powder may refer to powder particles each having a flat and elongated shape. A length ratio between a major axis and a minor axis (a major axis/a minor axis) of a particle of the flake powder may be 1.95 or higher, for example, although an example embodiment thereof is not limited thereto.

A length of each of a major axis and a minor axis of a particle of the spherical powder and a particle of the flake powder may be measured from an image of a cross-sectional surface taken in an X and Z direction (L-T cross-sectional surface) of a central portion of the multilayer electronic component taken in a width (Y) direction, obtained using a scanning electron microscope (SEM).

A base resin included in the conductive resin layers 131b and 132b may secure adhesiveness and may absorb impacts.

A base resin included in the conductive resin layers 131b and 132b may not be limited to any particular material, and any material which has adhesiveness and impact absorption and may be used to make paste by being mixed with conductive metal powder may be used. For example, the base resin may be implemented by an epoxy resin.

The external electrodes 131 and 132 may further include plating layers disposed on the conductive resin layers 131b and 132b to improve mounting properties.

For example, the plating layers may be configured as Ni-plated layers or Sn-plated layers. The plating layers may be formed by forming an Ni-plated layer and an Sn-plated layer in order on the conductive resin layers 131b and 132b, or may include a plurality of Ni-plated layers and/or a plurality of Sn-plated layers.

Figure 5:
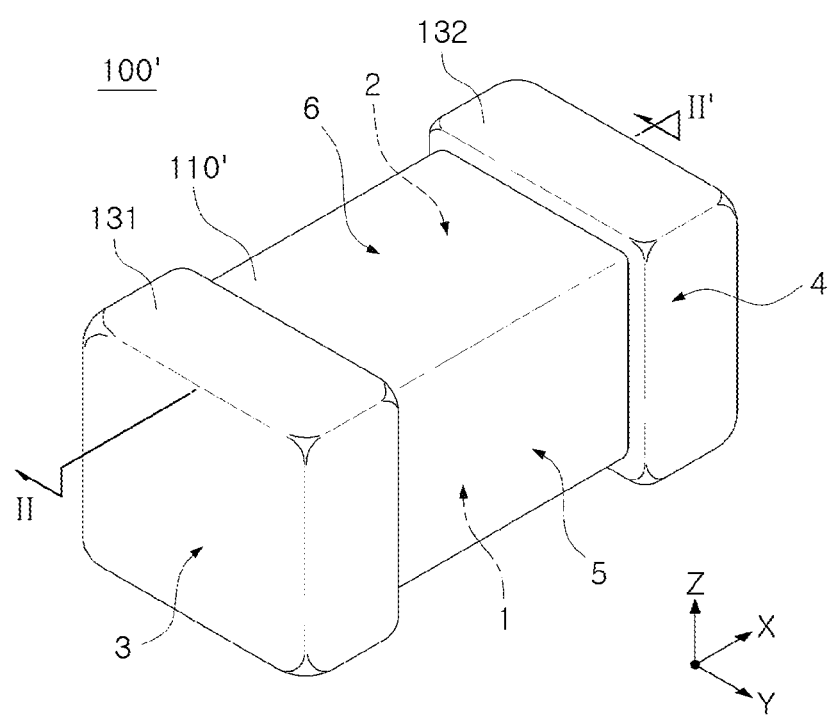
FIG. 5 is a perspective diagram illustrating a multilayer electronic component according to an example embodiment of the present disclosure.

FIG. 5 is a perspective diagram illustrating a multilayer electronic component according to an example embodiment.

Figure 6:
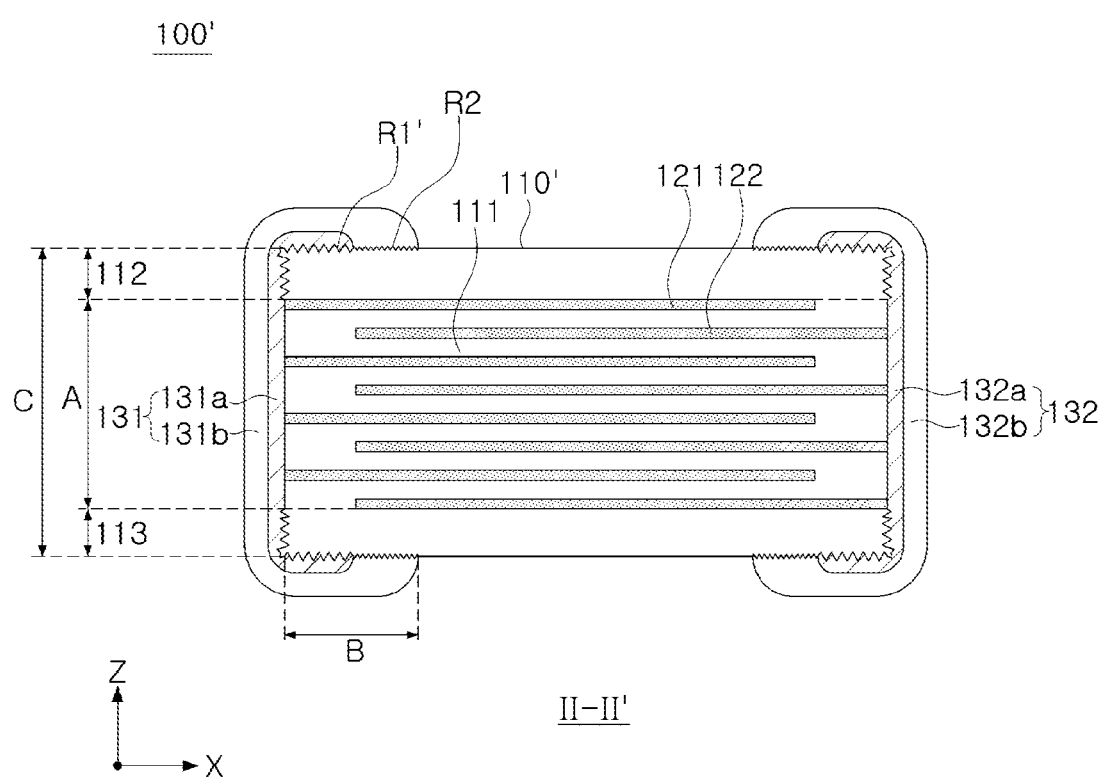
FIG. 6 is a cross-sectional diagram taken along line II-II' in FIG. 5.

FIG. 6 is a cross-sectional diagram taken along line II-II' in FIG. 5.

In the description below, a multilayer electronic component 100' will be described in greater detail in accordance with another example embodiment with reference to FIGS. 5 and 6. To avoid overlapping descriptions, the descriptions of the elements the same as the elements of the multilayer electronic component 100 will not be provided.

A multilayer electronic component 100' in another example embodiment may include a body 110' including a dielectric layer 111 and a capacitance forming portion A forming capacitance including first and second internal electrodes 121 and 122 alternately layered with the dielectric layer interposed therebetween and cover portions 112 and 113 disposed on and below the capacitance forming portion, and including first and second surfaces 1 and 2 opposing each other in the layering direction, third and fourth surfaces 3 and 4 connected to the first and second surfaces and opposing each other, and fifth and sixth surfaces 5 and 6 connected to the first to fourth surfaces and opposing each other, a first external electrode 131 disposed on the third surface and connected to the first internal electrode, and including a first electrode layer 131a extending to a portion of each of the first, second, fifth, and sixth surfaces and a first conductive resin layer 131b covering the first electrode layer, and a second external electrode 132 disposed on the fourth surface and connected to the second internal electrode, and including a second electrode layer 132a extending to a portion of each of the first, second, fifth, and sixth surfaces and a second conductive resin layer 132b covering the second electrode layer, and when a surface roughness of the cover portion in contact with the first and second electrode layers is defined as R1', and a surface roughness of each of the first, second, fifth, and sixth surfaces in contact with the first and second conductive resin layers is defined as R2, R1 and R2 may satisfy R1'>R2.

The body 110' may include the capacitance forming portion A disposed in the body 110' and forming capacitance including the first and second internal electrodes 121 and 122 alternately layered with the dielectric layer 111 interposed therebetween, and the cover portions 112 and 113 disposed on and below the capacitance forming portion A.

The capacitance forming portion A may contribute to forming capacitance of the capacitor, and may be formed by alternatively layering the plurality of first and second internal electrodes 121 and 122 with the dielectric layer 111 interposed therebetween.

The upper cover portion 112 and the lower cover portion 113 may be formed by disposing a single dielectric layer or two or more dielectric layers on each of upper and lower surfaces of the capacitance forming portion, and may prevent damage to an internal electrode caused by physical or chemical stress.

The upper cover portion 112 and the lower cover portion 113 may not include an internal electrode, and may include a material the same as a material of the dielectric layer 111.

According to the example embodiment, when a surface roughness of the cover portion in contact with the first and second electrode layers is defined as R1', and a surface roughness of each of the first, second, fifth, and sixth surfaces in contact with the first and second conductive resin layers is defined as R2, R1 and R2 may satisfy R1'>R2.

In the multilayer electronic component 100 in the aforementioned example embodiment, the surface roughness R1 is not formed in the connection portion C of the body 110, whereas in the multilayer electronic component 100' in the other example embodiment, a surface roughness R1' may be also formed on a surface of each of the cover portions 112 and 113 in the connection portion C of the body 110'.

Accordingly, cohesion force between the body 110' and the electrode layers 131a and 132a may improve such that warpage strength properties and moisture resistance reliability of the multilayer electronic component 100' may improve.

An arithmetical average roughness of R1' may be greater than 0.2 μm and 3.0 μm or less.

When an arithmetical average roughness of R1' is 0.2 μm or less, improvement of physical cohesion force between the electrode layers 131a and 132a and the body 110' obtained by an anchor effect may be insufficient. When the improvement of physical cohesion force between the electrode layers 131a and 132a and the body 110' is insufficient, warpage stress may be applied such that the conductive resin layers 131b and 132b may peel off. Accordingly, the electrode layers 131a and 132a may also peel off, or oxidation may occur on ends of the electrode layers 131a and 132a. Accordingly, insulation resistance may degrade or shorts may occur.

When an arithmetical average roughness of R1' exceeds 3.0 μm, stress may be concentrated on the electrode layers 131a and 132a when stress occurs such that cracks may be created.

Also, an arithmetical average roughness of R1' may be greater than an arithmetical average roughness of a region of the third and fourth surfaces in which the capacitance forming portion is in contact with the first and second electrode layers.

When an arithmetical average roughness of a region of the third and fourth surfaces in which the capacitance forming portion is in contact with the first and second electrode layers is the same as or greater than an arithmetical average roughness of R1', electrical connectivity between the second internal electrodes 121 and 122 and the electrode layers 131a and 132a may degrade.

According to the example embodiment, by increasing a surface roughness of a region of the first, second, fifth and sixth surfaces of the body which is in contact with the electrode layer, rather than a region in contact with the conductive resin layer, warpage strength properties may improve.

While the exemplary embodiments have been shown and described above, it will be apparent to those skilled in the art that modifications and variations could be made without departing from the scope of the present invention as defined by the appended claims.

What is claimed is:

1. A multilayer electronic component, comprising:
a body including a dielectric layer and first and second internal electrodes alternately layered in a layering direction with the dielectric layer interposed therebetween, and including first and second surfaces opposing each other in the layering direction, third and fourth surfaces connected to the first and second surfaces and opposing each other, and fifth and sixth surfaces connected to the first to fourth surfaces and opposing each other;
a first external electrode disposed on the third surface, connected to the first internal electrode, and including a first electrode layer extending to a portion of each of the first, second, fifth, and sixth surfaces and a first conductive resin layer covering the first electrode layer; and
a second external electrode disposed on the fourth surface, connected to the second internal electrode, and including a second electrode layer extending to a portion of each of the first, second, fifth, and sixth surfaces and a second conductive resin layer covering the second electrode layer,
wherein R1 and R2 satisfy R1>R2, in which R1 is defined as a surface roughness of each of the first, second, fifth, and sixth surfaces in contact with the first and second electrode layers, and R2 is defined as a surface roughness of each of the first, second, fifth, and sixth surfaces in contact with the first and second conductive resin layers.

2. The multilayer electronic component of claim 1, wherein an arithmetical average roughness of R1 is greater than 0.2 μm and 3.0 μm or less.

3. The multilayer electronic component of claim 1, wherein an arithmetical average roughness of R2 is 0.3 μm or less.

4. The multilayer electronic component of claim 1, wherein an arithmetical average roughness of R2 is greater than an arithmetical average roughness of a region of the first, second, fifth, and sixth surfaces exposed from the first and second external electrodes.

5. The multilayer electronic component of claim 1, wherein an arithmetical average roughness of R1 is greater than an arithmetical average roughness of the third and fourth surfaces.

6. The multilayer electronic component of claim 1, wherein the first and second conductive resin layers include a conductive metal and a base resin.

7. The multilayer electronic component of claim 1, wherein the first and second electrode layers include a conductive metal and glass.

8. The multilayer electronic component of claim 1, wherein a surface roughness of any portion of each of the first, second, fifth, and sixth surfaces in contact with the first and second electrode layers is defined as R1.

9. A multilayer electronic component, comprising:
a body including a dielectric layer and a capacitance forming portion including first and second internal electrodes alternately layered in a layering direction with the dielectric layer interposed therebetween and cover portions respectively disposed on and below the capacitance forming portion, and including first and second surfaces opposing each other in the layering direction, third and fourth surfaces connected to the first and second surfaces and opposing each other, and fifth and sixth surfaces connected to the first to fourth surfaces and opposing each other;
a first external electrode disposed on the third surface, connected to the first internal electrode, and including a first electrode layer extending to a portion of each of the first, second, fifth, and sixth surfaces and a first conductive resin layer covering the first electrode layer; and
a second external electrode 132 disposed on the fourth surface, connected to the second internal electrode, and including a second electrode layer extending to a portion of each of the first, second, fifth, and sixth surfaces and a second conductive resin layer covering the second electrode layer,
wherein R1' and R2 satisfy R1'>R2, in which R1' is defined as a surface roughness of the cover portions in contact with the first and second electrode layers, and R2 is defined as a surface roughness of each of the first, second, fifth, and sixth surfaces in contact with the first and second conductive resin layers.

10. The multilayer electronic component of claim 9, wherein an arithmetical average roughness of R1' is greater than 0.2 μm and 3.0 μm or less.

11. The multilayer electronic component of claim 9, wherein an arithmetical average roughness of R2 is 0.3 μm or less.

12. The multilayer electronic component of claim 9, wherein an arithmetical average roughness of R2 is greater than an arithmetical average roughness of a region of the first, second, fifth, and sixth surfaces exposed from the first and second external electrodes.

13. The multilayer electronic component of claim 9, wherein an arithmetical average roughness of R1' is greater than an arithmetical average roughness of a region of the third and fourth surfaces in which the capacitance forming portion is in contact with the first and second electrode layers.

14. The multilayer electronic component of claim 9, wherein the first and second conductive resin layers include a conductive metal and a base resin.

15. The multilayer electronic component of claim 9, wherein the first and second electrode layers include a conductive metal and glass.

16. The multilayer electronic component of claim 9, wherein a surface roughness of any portion of each of the first, second, fifth, and sixth surfaces in contact with the first and second electrode layers is defined as R1'.

* * * * *